(12) United States Patent
Hahn et al.

(10) Patent No.: US 9,941,664 B1
(45) Date of Patent: Apr. 10, 2018

(54) HYBRID III-V ON SILICON LASER DEVICE WITH TRANSVERSE MODE FILTER

(71) Applicant: International Business Machines Corporation, Armonk, NY (US)

(72) Inventors: Herwig Hahn, Zurich (CH); Folkert Horst, Wettingen (CH); Marc Seifried, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/466,323

(22) Filed: Mar. 22, 2017

(51) Int. Cl.
| | |
|---|---|
| *H01S 5/00* | (2006.01) |
| *H01S 5/20* | (2006.01) |
| *H01S 5/343* | (2006.01) |
| *H01S 5/10* | (2006.01) |
| *H01S 5/30* | (2006.01) |

(Continued)

(52) U.S. Cl.
CPC ............ *H01S 5/2022* (2013.01); *H01S 5/021* (2013.01); *H01S 5/1014* (2013.01); *H01S 5/1028* (2013.01); *H01S 5/12* (2013.01); *H01S 5/2027* (2013.01); *H01S 5/2031* (2013.01); *H01S 5/2054* (2013.01); *H01S 5/3054* (2013.01); *H01S 5/343* (2013.01); *H01S 5/06256* (2013.01); *H01S 5/06258* (2013.01)

(58) Field of Classification Search
CPC .... H01S 5/2054; H01S 5/1014; H01S 5/1028; H01S 5/12; H01S 5/3054; H01S 5/343; H01S 5/06256; H01S 5/06258; H01S 5/021; H01S 5/2022; H01S 5/2027; H01S 5/2031

See application file for complete search history.

(56) References Cited

U.S. PATENT DOCUMENTS 9,442,247 B2 *  9/2016  Deppe ................ G02B 6/12004
9,698,564 B1 *  7/2017  Shubin .................... H01S 5/026
(Continued)

OTHER PUBLICATIONS

Lamponi, "Hybrid III-V on silicon lasers for telecommunication applications", HAL archives-ouvertes, http://tel.archives-ouvertes.fr/tel-00769402, submitted on Jan. 1, 2013; 182 pages.
(Continued)

*Primary Examiner* — Kinam Park
(74) *Attorney, Agent, or Firm* — Scully, Scott, Murphy & Presser, P.C.; Daniel P. Morris, Esq.

(57) ABSTRACT

A hybrid III-V on silicon laser device includes a layer structure, with a stack of III-V semiconductor gain materials, a silicon waveguide core and a cladding structure. The semiconductor gain materials stack is along a stacking direction, which is perpendicular to a main plane of the stack. The silicon waveguide core extends along a longitudinal direction, parallel to the main plane. The cladding structure extends between said waveguide core and the stack. The device further comprises an optical coupling structure formed in the layer structure. This coupling structure is designed: 1) to allow a hybrid-mode optical coupling of radiation between the stack of III-V semiconductor gain materials and the tapered waveguide core; and 2) to favor a coupling of a fundamental transverse optical mode of said radiation over a coupling of one or more higher-order transverse optical modes of said radiation from the stack into the waveguide core.

20 Claims, 3 Drawing Sheets

(51) Int. Cl.
*H01S 5/12* (2006.01)
*H01S 5/02* (2006.01)
H01S 5/0625 (2006.01)

(56) References Cited

U.S. PATENT DOCUMENTS

| | | |
|---|---|---|
| 9,742,150 B1* | 8/2017 | Hofrichter ............ H01S 5/1014 |
| 2006/0131603 A1 | 6/2006 | Cho |
| 2014/0153601 A1* | 6/2014 | Doerr ...................... H01S 5/125 |
| | | 372/44.01 |
| 2015/0253472 A1 | 9/2015 | Kumar et al. |
| 2015/0270684 A1* | 9/2015 | Suzuki .................. H01S 5/1237 |
| | | 372/45.012 |

OTHER PUBLICATIONS

Park et al., "Hybrid Vertical-Cavity Laser with Lateral Emission into a Silicon Waveguide", Laser Photonics, Rev. 9, vol. 3, pp. L11-L15, (2015) / DOI 10.1002/lpor.201400418, First Published Apr. 10, 2015.

* cited by examiner

HYBRID III-V ON SILICON LASER DEVICE WITH TRANSVERSE MODE FILTER

BACKGROUND

The invention relates in general to the field of hybrid III-V on silicon laser devices.

Silicon photonics relates to applications of photonic systems, wherein silicon is used as an optical medium. The fact that it allows the integration of the photonic functionality, while leveraging know-how with silicon and its mass fabrication compatibility makes it a very attractive technology platform.

Yet, the indirect bandgap of silicon makes it a poor light emitter. Therefore, to build on-chip laser sources, several research groups have proposed a hybrid integration of III-V materials on silicon photonics structures, as for instance described in "Hybrid III-V on silicon lasers for telecommunication applications", by Marco Lamponi, Université Paris Sud-Paris XI, 2012 <NNT: 2012PA112039>, <tel-00769402>, see https://tel.archives-ouvertes.fr/tel-00769402/.

In such laser sources, a single-mode operation is desired as this increases the efficiency and modulation bandwidth, as well as the output power of the fundamental (or the desired) mode. Single-mode operation of hybrid III-V on silicon lasers can for instance be achieved, based on, e.g., distributed feedback (DFB) laser architectures, which make it possible for the device to lase on a single longitudinal mode. Other laser architectures that can be contemplated for this purpose are, e.g., ring resonator lasers, arrayed waveguide grating lasers or sampled grating, distributed Bragg reflector (DBR) lasers. Often though, the cross section of such laser devices allows for higher-order transverse modes.

SUMMARY

According to a first aspect, the present invention is embodied as a hybrid III-V on silicon laser device. The device comprises a layer structure, with a stack of III-V semiconductor gain materials, a silicon waveguide core and a cladding structure. The stack of III-V semiconductor gain materials is stacked along a stacking direction z, which is perpendicular to a main plane of the stack. The silicon waveguide core extends along a longitudinal direction, parallel to the main plane of the stack of III-V semiconductor gain materials. The cladding layer extends between said waveguide core and said stack of III-V semiconductor gain materials. The device further comprises an optical coupling structure formed in the layer structure. This coupling structure is designed: on the one hand, to allow a hybrid-mode optical coupling of radiation between the stack of III-V semiconductor gain materials and the tapered waveguide core; and, on the other hand, to favor a coupling of a fundamental transverse optical mode of said radiation over a coupling of one or more higher-order transverse optical modes of said radiation from the stack of III-V semiconductor gain materials into the waveguide core, so as to prevent said one or more higher-order transverse optical modes from lasing, in operation.

This way, higher-order modes will not substantially compete for gain with the fundamental transverse mode, so as to increase the device's efficiency.

The coupling structure is preferably designed to favor the coupling of the fundamental transverse optical mode over the coupling of all of the higher-order transverse optical modes from the stack of III-V semiconductor gain materials into the waveguide core, so as to prevent said all of the higher-order transverse optical modes from lasing, in operation.

In preferred embodiments, the coupling structure comprises tapers, which are structured in the waveguide core. The tapers are designed to allow said radiation to be optically coupled between the stack of III-V semiconductor gain materials, and the tapers are further designed to favor optical coupling of the fundamental transverse mode between the stack of III-V semiconductor gain materials and the waveguide core. The coupling structure further comprises a damper configured to damp the one or more higher-order transverse optical modes in said stack, so as to prevent the one or more higher-order transverse optical modes from lasing, in operation.

As a result, the fundamental mode gets spatially separated from the higher-order modes. That is, the fundamental mode is essentially in the waveguide and the higher-order transverse modes essentially remain in the III-V stack. This, in turn, allows the damper to be designed such that the propagation loss of higher-order transverse modes in the III-V stack is significantly larger, e.g., by two orders of magnitude, than for the fundamental mode in the waveguide. Still, the damping section may be achieved without substantial additional complexity in the fabrication process.

The damper comprises a layer portion of material extending parallel to said stack of III-V semiconductor gain materials, centered thereon, opposite to the waveguide core with respect to the stack, and dimensioned so as to damp the one or more higher-order transverse optical modes in said stack.

In embodiments, the device further comprises a pair of doped layers of semiconductor materials, including a first doped layer and a second doped layer, the pair comprising an n-doped layer and a p-doped layer, wherein the pair of doped layers extend essentially parallel to said main plane, on respective sides of the stack, so as for the waveguide core to extend opposite to the stack of III-V semiconductor gain materials with respect to the first doped layer. The device also comprises two sets of ohmic contacts, including a first set and a second set, in contact with the first doped layer and the second doped layer, respectively, wherein the second set of ohmic contacts is structured so as to form said damper. Advantageously here, no additional layer is needed to achieve the desired damping effect.

Preferably, said first doped layer is the n-doped layer and the second doped layer is the p-doped layer.

The second set of ohmic contacts may for instance be structured so as to form two parallel strips extending laterally along two opposite edges of the stack, the two strips connected by said layer portion of material.

In such a case, the two parallel strips shall preferably extend laterally at said opposite edges of the stack, so as for said layer portion of material to form, together with sections of the strips it connects, a section that extends substantially over a whole width of the stack. Such a design, which reuses existing layers to achieve the damper, nevertheless allows substantial optical propagation losses for the coupling of the higher-order modes.

In general, the present devices can for instance be configured so as for the optical propagation loss for the coupling of the one or more higher-order transverse optical modes to be of at least 1.0 dB, or even at least 3.0 dB.

Meanwhile, the present devices can also be configured so as for the optical propagation loss for the coupling of the fundamental transverse optical modes not to exceed 0.3 dB (or even 0.1 dB).

In embodiments, the present laser devices can be configured as a distributed feedback laser, a distributed Bragg reflector laser, or a ring laser.

In embodiments where the laser device is configured as a distributed feedback laser, the waveguide core can for example be structured so as to comprise: an input portion; a middle portion; and an output portion, wherein the middle portion is connected to the input portion and the output portion via respective tapers that widen, each, inwardly toward the middle portion, and each of the input portion and the output portion comprises a distributed feedback reflector.

Preferably, the stack of III-V semiconductor gain materials has a form factor, whereby an average dimension of the stack in a plane parallel to its main plane is substantially larger than an average dimension of the stack along said stacking direction z.

For example, the average thickness of said stack of III-V semiconductor gain materials may be between 50 nm and 400 nm, or even between 220 nm and 290 nm.

In embodiments, the cladding layer comprises a material arranged between the bonding layer and the waveguide core, which material has a refractive index that is equal or larger than 1.54 for said radiation and a bandgap, which, in energy units, is larger than an average energy of said radiation.

Preferably, a minimal distance between a lower layer of said stack of III-V semiconductor gain materials and each of the tapered waveguide core is between 10 and 1000 nm.

According to another aspect, the invention is embodied as a method of operating such a laser device. This method essentially revolves around energizing the stack of III-V semiconductor gain materials to cause a hybrid-mode optical coupling of radiation between the stack of III-V semiconductor gain materials and the tapered waveguide core. As per the design of the device, the coupling of the fundamental transverse optical mode is favored over the coupling of the one or more higher-order transverse optical modes, so as to prevent the latter from lasing, consistently with the design of the present devices.

Devices and methods embodying the present invention will now be described, by way of non-limiting examples, and in reference to the accompanying drawings.

BRIEF DESCRIPTION OF SEVERAL VIEWS OF THE DRAWINGS

FIGS. 3 and 4 show other cross-sections, transverse to that of FIG. 2, which respectively depict sections B-B and C-C, in corresponding cutting planes as identified in FIG. 1. In addition, FIGS. 3 and 4 depict metallic vias or plating (not shown in FIGS. 1-2, for conciseness), as involved in embodiments;

The three rows illustrate the coupling for the first three modes (including the fundamental mode on top, FIGS. 5A-5B);

The left-hand side column pertains to the electric field as obtained in outer regions, for thinnest sections of the waveguide core (outside the tapered portions, e.g., at the level of FIG. 3); and the right-hand side columns depicts the electric field at the center, e.g., at the level of FIG. 4.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

As noted in the background section, hybrid integration of III-V materials on silicon photonics structures has been proposed, whereby laser sources can be obtained, for which single-mode operation is desired. Yet, and as it can be realized, higher-order modes might be allowed by such laser devices, which will compete for gain with the fundamental mode, such that the devices may lase on a number of transverse modes, all at the same wavelength.

Moreover, for on-chip lasers, the light must be coupled from the III-V material to the underlying silicon waveguide. And this is mostly achieved using adiabatic couplers, which ensure low loss coupling of the fundamental mode. As one may further realize, the higher-order transverse modes will thereby not couple with the same efficiency, as the adiabatic couplers are usually optimized on the fundamental mode. Therefore, the higher-order transverse modes will not contribute to the output power, yet they will compete for the gain of the active region, hence lowering the overall efficiency.

The present Inventors saw this shortcoming as a challenge and devised a mechanism to favor lasing on a single longitudinal and transverse mode, so as to increase the device's efficiency.

The following description is structured as follows. First, general embodiments and high-level variants are described (sect. 1). The next section addresses more specific embodiments and technical implementation details (sect. 2).

1. General Embodiments and High-Level Variants

In reference to FIGS. 1-4, an aspect of the invention is first described, which concerns a hybrid III-V on silicon laser device 10, which generally allows for hybrid optical modes. It is furthermore assumed that the cross-section of the laser structure allows for higher-order transverse modes, in addition to the fundamental mode. The fundamental (i.e., $TEM_{00}$) mode is the lowest order mode (it is characterized by having the simplest intensity profile). Higher-order modes are relatively larger compared to the $TEM_{00}$ mode and show more complex intensity profiles.

The device 10 basically comprises a layer structure, with a stack 108 of III-V semiconductor gain materials, a silicon waveguide core 102 and a cladding structure 103.

The stack 108 of III-V semiconductor gain materials is stacked along stacking direction z, which is perpendicular to the main plane, (parallel to plane (x, y), of the stack 108. In the present context, a thin III-V material stack 108 is typically assumed, e.g., on the order of 300 nm or less.

The waveguide core 102 extends along a longitudinal direction y, parallel to the main plane of the stack 108. The waveguide core 102 may for instance be patterned from a top silicon (Si) layer of an initial Si substrate 100-102 having a buried oxide layer 101, as assumed in the accompanying drawings.

The cladding structure comprises a layer 103, which extends between the waveguide core 102 and the stack 108 of III-V gain materials. The cladding layer 103 may for instance comprise $SiO_2$. However, the material of the cladding layer 103 may also comprise other materials, such as $SiON$, $Si_xN_y$, $AlN$, $AlO_x$, $AlON$, $HfO_x$, $Ta_2O_5$, $TiO_x$, or $ZrO_x$, for reasons that will become apparent later.

The device 10 further comprises an optical coupling structure 110c, 1022, 1024, which is formed in the layer structure. The coupling structure 110c, 1022, 1024 is notably designed to allow a hybrid-mode optical coupling of radiation between the stack 108 of III-V semiconductor gain materials and the tapered waveguide core 102. In general, the optical coupling may be bidirectional, i.e., it may occur from the III-V stack 108 to the waveguide core 102 and, conversely, from the waveguide core 102 to the III-V stack 108.

To that aim, the waveguide core 102 is preferably structured so as to have two tapers 1022, 1024 widening inwardly, as assumed in the accompanying drawings. The tapers 1022, 1024 are more preferably designed to allow an adiabatic coupling and, in turn, ensures a low loss coupling of the fundamental mode.

Adiabatic optical coupling is known per se. Adiabaticity is considered to be reached when the optical distribution is defined by the same eigenmode (i.e., supermode) of the coupled system throughout the contact, with minimal scattering to other supermodes or radiation modes. Adiabaticity, however, is a relative term: the tapers will be considered adiabatic when the optical loss is below a predefined level, e.g. less than 15% or typically less than 10%. In that respect, the tapered portions of the waveguide 102 may be designed to have a slope that optimizes the optical coupling. The length of the taper portions shall typically be between 10 μm and 10 mm, which range of lengths allow for exceeding adiabaticity limits, in practice However, such tapers will typically not allow higher-order transverse modes to be optically coupled with the same efficiency, e.g., because the tapers 1022, 1024 are normally optimized for coupling one mode (e.g., the fundamental mode). Therefore, the sole tapers 1022, 1024 will typically not allow higher-order transverse modes to contribute to the output power of the laser device.

Yet, and as present inventors have realized, the optical coupling structure 110c, 1022, 1024 may nevertheless be designed so as to make sure that the device lases on essentially a single longitudinal and transverse mode, to increase the device's efficiency. As explained below in detail, the present approach relies on a damping mechanism, which is configured to induce sufficient intra-cavity loss for higher-order transverse modes and thereby prevent them from lasing, in operation.

To that aim, the optical coupling structure may include additional components, formed in the layer structure housing the stack 108 of III-V materials. As a result, the present coupling structure has two functions. First, it favors the coupling of the fundamental transverse optical mode over higher-order modes. In fact, the coupling structure may be designed so as to favor the coupling of the fundamental mode over the coupling of all of the higher-order modes. In addition, the coupling structure can be designed so as for the propagation loss of the higher-order modes to be larger than the propagation loss of the fundamental mode (which is coupled to the silicon waveguide by the coupling structure). This way, higher-order modes will have a higher intra-cavity loss than the fundamental mode and will therefore not substantially compete for gain with the fundamental transverse mode. In other words, the coupling structure prevents higher-order modes from lasing, in operation.

The present invention may further be embodied as an optoelectronic device, which comprises a laser device as described above. The optoelectronic device may notably comprise an integrated circuit, or IC, monolithically integrated with the laser device, as a complementary metal oxide semiconductor integrated circuit, or CMOS IC. The optoelectronic device may for instance be a BiCMOS device and said integrated circuit may comprise a heterostructure bipolar transistor.

Figure 2:
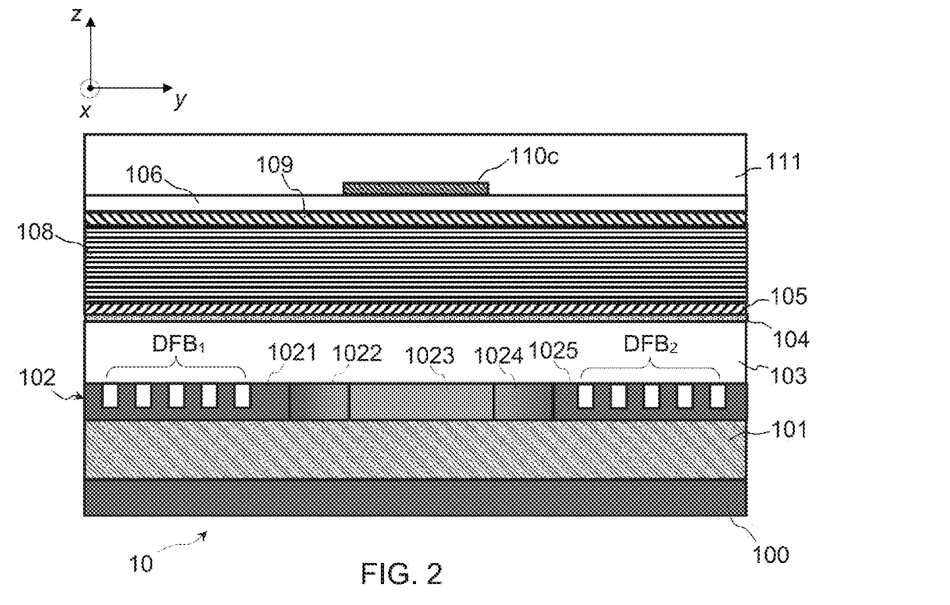
FIG. 2 is a 2D cross-sectional view of the device of FIG. 1, portraying section A-A in the cutting plane identified in FIG. 1.
Figure 3:
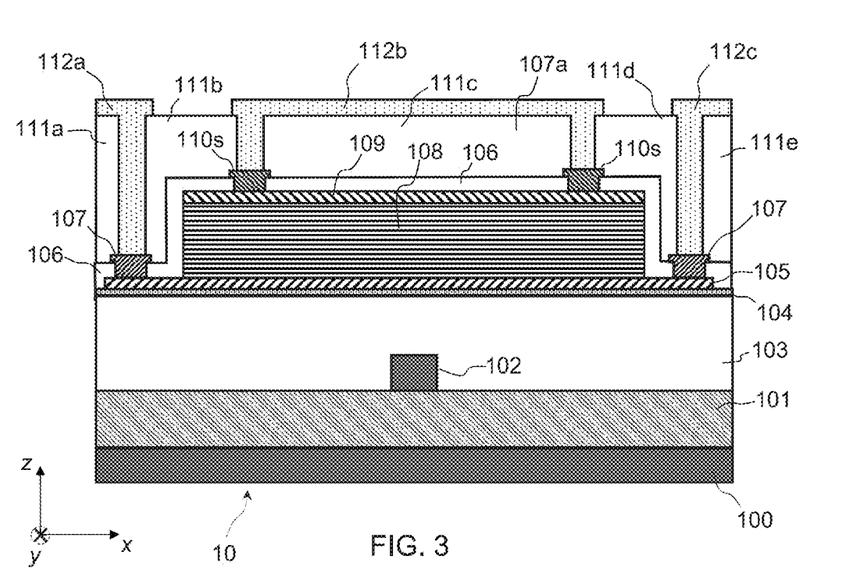
Figure 4:
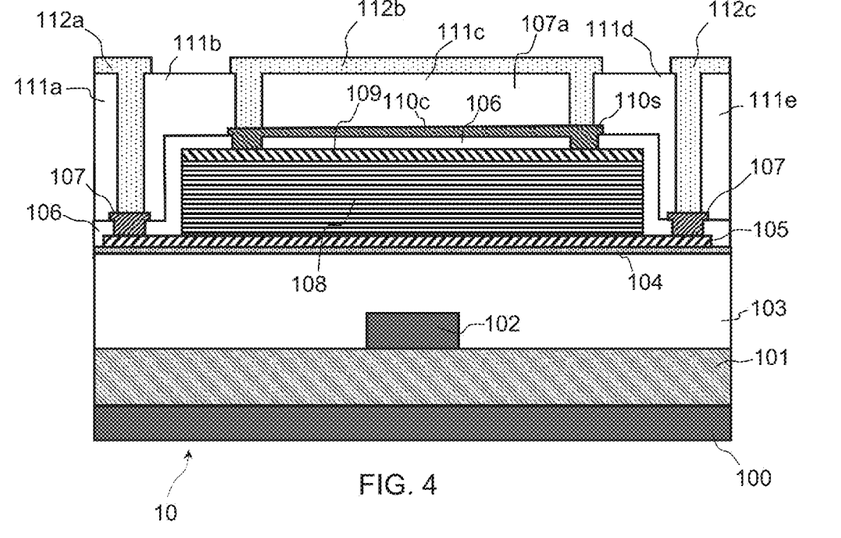

As for example seen in FIGS. 2-4, the laser device 10 may comprise a pair 105, 109 of doped layers of semiconductor materials, i.e., a first doped layer 105 and a second doped layer 109. As usual, this pair comprises an n-doped layer and a p-doped layer. For example, the first doped layer is the n-doped layer 105 and the second doped layer 109 is the p-doped layer, as in FIGS. 2-4. Layers 105, 109 may be regarded as forming part of the stack of III-V materials.

In the present devices, current is typically injected vertically, i.e., along the stacking direction z and typically from the top (as assumed in the accompanying drawings). To that aim, the present devices typically comprise two sets 107, 110 of ohmic contacts (see FIGS. 3-4), which are configured to allow vertical current injection in the stack 108 of III-V semiconductor gain materials. The ohmic contacts are meant to be contacted by electrodes (e.g., metal vias, or plating metal 112a-112c). An ohmic contact is typically a small conductive pad, i.e., a small portion of material(s), or an area where an electrode (or via, or a plating metal) contacts a respective semiconductor layer 105, 109. It may notably comprise a transition region of material between the electrode's material(s) and that layer's 105, 109, e.g., the transition region formed after alloying the electrode and the semiconductor layer. Ohmic contacts are known per se. Here, the two sets of contacts may typically consist of:

a first set of one or more n-type contacts 107, in contact with the n-doped layer 105; and a second set of one or more p-type contacts 110, in contact with the p-doped layer 109.

Note, however, that the orientation of the p-doped layer and the n-doped layer may be reversed and current injection may be made from below, contrary to the structures depicted in FIGS. 1-4. In all cases, a passivation layer 106 may be needed, suitably structured (with the contacts 107, 110 realized as through-vias).

The upper structure above the top, doped layer 109 and the contact layer 110 is typically cladded too, e.g., with a $SiO_2$ layer 111a-e. The top cladding structure 111a-e can typically be structured so as to allow electrical access to the contacts 107, 110 via the metallic vias and/or plating metals 112a-c, as depicted in FIGS. 3-4. In addition, the present devices may typically comprise a bonding layer 104 between the lower doped layer 105 and the cladding layer 103 of the lower structure. The bonding layer 104 may for instance comprise $Al_2O_3$.

Next, the layer structure housing the stack 108 may typically comprise an electron blocking layer (or EBL, not depicted in the drawings, for conciseness), which extends parallel to the main plane of the stack 108 of III-V materials, so as to separate the latter from the p-doped layer, e.g., on top. The EBL may for instance comprise InAlAs.

The stack 108 of III-V semiconductor gain materials may further comprise two separate confinement heterostructures, or SCHs (not shown), so as for the active region of the stack 108 to be sandwiched between the SCHs. The active region may for instance comprise multiple quantum well structures, as usual in the art. Each of the SCHs and the EBL may be regarded as forming part of the stack 108, in addition to its active component and layers 105, 109.

In addition, the stack 108 of III-V semiconductor gain materials is preferably embedded, laterally, in a current blocking layer (not shown). This current blocking layer extends essentially parallel to the main plane of the stack 108, i.e., parallel to plane (x, y). The current blocking layer typically comprises an oxide. In variants, it may have a pnpn-InP structure or a semi-insulating InP (e.g., Fe-doped) configuration.

Note that such a current blocking layer too may be regarded as forming part of the stack, although it does not necessarily comprise III-V semiconductor materials. Still, the current blocking layer would likely form part of the layer structure in which the stack 108 is formed.

In preferred embodiments, the coupling structure is advantageously achieved thanks to two distinct parts: a damper 110c, 110s, formed in the upper structure, above the stack 108 of III-V materials and tapers 1022, 1024 provided in the waveguide core 102 underneath. Namely, tapers 1022, 1024 are structured in the waveguide core 102, to allow radiation to be optically coupled between the stack 108 of III-V semiconductor gain materials. The tapers 1022, 1024 are further designed to favor the optical coupling of the fundamental transverse mode between the stack 108 of III-V semiconductor gain materials and the waveguide core 102, whereas the damper 110c allows higher-order transverse optical modes to be damped within the stack 108. What is damped here is the radiation intensity of higher-order modes in the III-V stack, i.e. the propagation loss per unit length dB/cm is large for such modes.

Figure 5A:
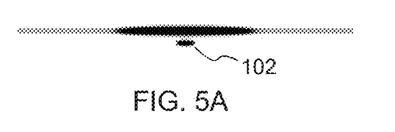
FIGS. 5A-5F show a density plot of component $E_x$ of the electric field (in absolute values) of a hybrid-mode optical coupling of radiation between the stack of III-V semiconductor gain materials and the tapered waveguide core of a device as in FIGS. 1-4, as simulated by the present inventors. In detail.
Figure 5B:
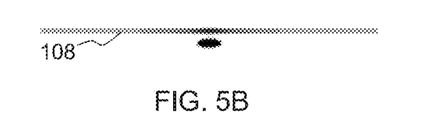
Figure 5C:
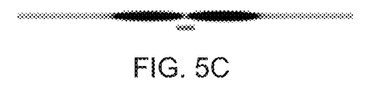
Figure 5D:
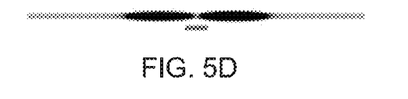
Figures 5E, 5F, 6:
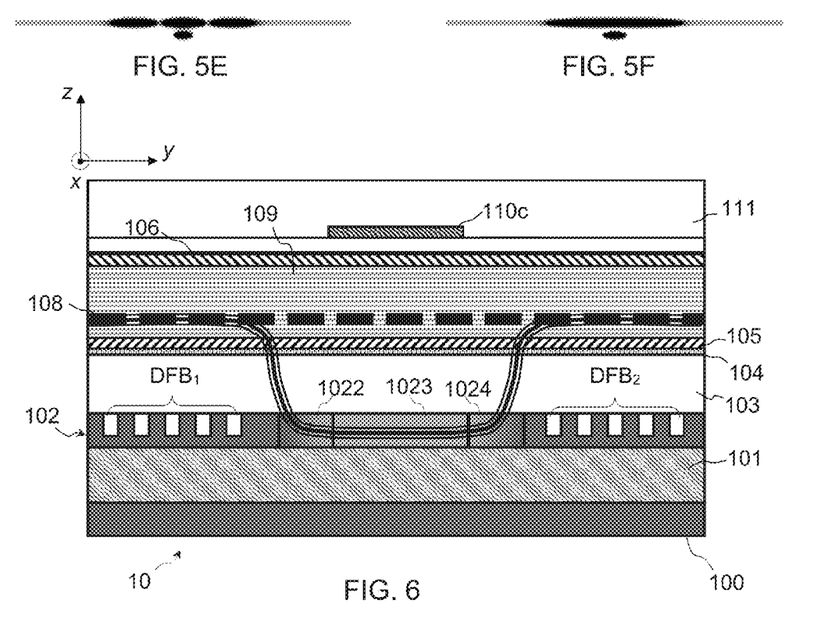
FIG. 6 schematically illustrates the longitudinal damping of higher-order modes, in a cross-section as in FIG. 2, using lines that reflect a main intensity of the modes. The compound line and the dashed line pertain to the fundamental mode and higher-order mode, respectively. Such a depiction is only approximate and do not faithfully reflect the underlying physics (as hybrid modes are involved) and must rather be considered as a guide for the eyes.

As a result of the coupler, the fundamental mode gets spatially separated from the higher-order modes, as schematically illustrated in FIG. 6. That is, the fundamental mode is essentially in the waveguide 102 and the higher-order transverse modes essentially remain in the III-V stack 108. This, in turn, allows the damper to be designed such that the propagation loss of higher-order transverse modes in the III-V stack is significantly larger, e.g., by two orders of magnitude, than for the fundamental mode in the waveguide 102.

Indeed, to efficiently prevent higher-order transverse modes from lasing, such modes must have an intra-cavity loss that is higher than their gain (the laser having a gain section where light is amplified in the III-V material stack 108). At the level of the stack 108, the overlap of the optical mode with the III-V material is high. The tapers 1022, 1024 in the waveguide core 102 allow light to be coupled into the middle portion 1023 of the waveguide core 102, so as to transfer light from the III-V stack to the silicon, where essentially the fundamental transverse mode is coupled.

In other words, the coupling structure can be designed so as to reduce the overlap of the fundamental mode with the III-V material stack in the middle section of the waveguide 1023, whereas in the outer sections of the waveguide 1021 and 1025 the overlap of the fundamental mode with the III-V material stack is large.

Meanwhile, higher-order transverse modes may have a high overlap with the III-V material (before or after the tapers and between the tapers). The damping area can thus be designed such that the effect of damping increases with the overlap of a mode with the III-V material. Therefore, higher-order transverse modes can be damped and this, in proportions that may be significantly higher than for the fundamental mode (compare FIGS. 5A, C and E with FIGS. 5B, D and F).

The high loss of the higher-order transverse modes prevents them from reaching the lasing condition. Thus, lasing occurs essentially for the fundamental mode only. The present coupling structures may therefore be regarded as a filter. As discussed below, the damping section may be achieved without substantial additional complexity in the fabrication process.

In embodiments, the damper comprises a layer portion 110c of material extending parallel to the stack 108 of III-V materials, centered thereon, i.e., opposite to the waveguide core 102 with respect to the stack 108. The damper is suitably dimensioned, so as to be able to damp higher-order transverse modes in the stack. That is, the damper need be dimensioned so as to cause an optical propagation loss for all optical modes having a large overlap with the III-V stack 108.

Advantageously, the damper may be designed so as to reuse elements of the layer structure of the device 10. For instance, and as depicted in FIGS. 2-4, the laser device 10 may comprise a pair 105, 109 of doped layers, wherein layers 105, 109 typically extend, each, essentially parallel to the main plane of the stack 108, on respective sides of the stack 108. Thus, the waveguide core 102 extends opposite to the stack 108 of III-V materials with respect to the first doped layer 105 in that case. In such a structure, two sets 107, 110 of ohmic contacts (including a first set 107 and a second set 110) are provided in contact with the first doped layer 105 and the second doped layer 109, respectively. Advantageously then, the second set of ohmic contacts 110 may be structured so as to form the damper 110c, such that no additional layer is needed to achieve the desired damping effect.

Figure 1:
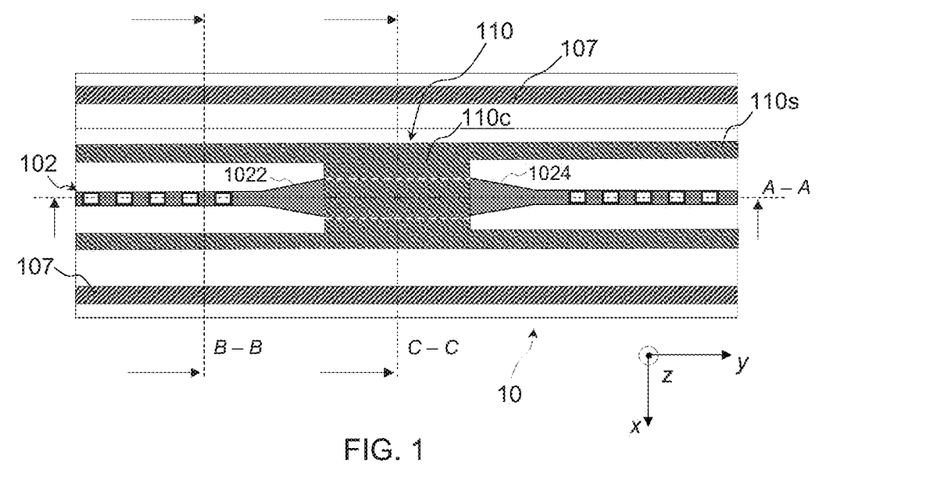
FIG. 1 is a top view of a hybrid III-V on silicon laser device (showing selected components of this device), according to embodiments.

Advantageously, in embodiments as depicted in FIGS. 1-4, little additional processing is needed to form the damper. Indeed, since the second set of ohmic contacts 110 is typically structured so as to form two parallel strips 110s extending laterally along two opposite edges of the stack 108, the two strips 110s can simply be connected by a layer portion 110c of material, at the center. I.e., the top contact layer 110 can be patterned so as to exhibit both the central layer portion 110c and the strips 110s, as seen in FIG. 1. Advantageously, this connecting portion 110c can furthermore be formed from the same ohmic contact metal layer 110 as the strips 110s.

As further seen in FIG. 1, the two parallel strips 110s extend laterally at opposite edges of the stack 108, so as for said layer portion 110c of material to form, together with sections of the strips 110s it connects, a section that preferably extends substantially over a whole width of the stack 108 (the width measured along axis x).

Using such a design, the device 10 may well be configured so as for the optical propagation loss for the coupling of the higher-order modes to be of at least 1.0 dB. Note that, although the propagation loss is, in general, expressed in dB/cm, the actual loss of a mode depends on the actual length of the damper. The values in dB indicated above (as well as in other places of this document) take into account typical dimensions for the damper and are therefore expressed in dB. Preferably though, the optical propagation loss for coupling higher-order modes will be of at least 3.0 dB. Losses up to 10 dB can in principle be achieved for such modes, by suitably designing the damper 110c. In particular, the propagation loss in the middle section can typically be two orders of magnitude larger than the propagation loss of the fundamental mode (as measured in dB/cm), as noted earlier. The actual propagation losses for the coupling of the fundamental mode may typically not to exceed 0.3 dB, or even 0.1 dB, provided that the tapers are suitably designed. In typical embodiments though, the propagation loss will typically be of at least 0.015 dB (for the fundamental mode coupling).

In general, the present devices may be configured as a distributed feedback (DFB) laser, a distributed Bragg reflector (DBR) laser, or a ring laser. Particularly good results can be obtained by designing the device 10 as a DFB laser, according to simulations performed by the Inventors (FIG. 5). In that case, the waveguide core 102 is designed so as to include distributed feedback reflectors DFB1, DFB2. Namely, the waveguide core 102 can be structured so as to comprise: an input portion 1021; a middle portion 1023; and an output portion 1025. The middle portion 1023 is connected to the input portion 1021 and the output portion 1025 via respective tapers 1022, 1024 that widen, each, inwardly toward the middle portion, while each of the input portion 1021 and the output portion 1025 comprises a distributed feedback reflector DFB1, DFB2.

At present, preferred dimensions and other properties of the various components of the device 10 are discussed in detail. To start with, the stack 108 of III-V materials may have a form factor, as seen in FIG. 2. That is, an average dimension of the stack 108 (in a plane parallel to its main plane) is substantially larger than the average, out-of-plane dimension of the stack 108 (i.e., along the stacking direction z). Thus, shallow III-V stacks are preferred in the present context (e.g., less than 500 nm thick), be it to ease their integration with other devices in an optoelectronic device.

For example, the average thickness of the stack 108 of III-V gain materials may be between 50 nm and 400 nm (as measured along the stacking direction z). Preferably though, the average thickness of the stack 108 is between 220 nm and 290 nm.

In addition, the cladding layer 103 may comprise a material, arranged between the bonding layer 104 and the waveguide core 102, which has a refractive index that is equal to or larger than 1.54 for a radiation of interest, while its bandgap is (in energy units) larger than the average energy of said radiation.

As it can be realized, the value of 1.54 imposes a higher refractive index than that of $SiO_2$, for all wavelengths of interest. The wavelength range of interest is in the optical range (i.e., 100 nm-1 mm, according to DIN 5031); the terminology "radiation" as used herein refers to electromagnetic radiation in the wavelength range between 100 nm and 1 mm. However, the wavelength range will, in most applications, be between 200 nm and 7.5 µm. In particular, wavelengths of 1.3 and 1.55 µm are typically contemplated (and possibly 980 nm). For particular subsets of wavelengths, the cladding layer 103 may nevertheless have a refractive index equal to or larger than 1.45.

Using a higher refractive index material 103 allows less constraints in the design rules of the device 10 as such a material allows larger physical gaps between the III-V stack 108 and the Si waveguide core 102. This, in turn, makes it possible to ease the integration of the device 10, e.g., in CMOS integrated circuits.

In practice, suitable materials 103 will have a refractive index that is larger than 1.7 (for radiations of interest). In addition, such materials 103 will preferably have a refractive index that is less than 2.4 for such radiations. Thus, suitable materials may typically have a refractive index that is between 1.7 and 2.4.

In particular, the material 103 may comprise one or more of the following materials: SiON, $Si_xN_y$, AlN, $AlO_x$, AlON, $HfO_x$, $Ta_2O_5$, $TiO_x$, and $ZrO_x$, as noted earlier. Although several of these materials may, in principle, be involved, one preferably uses a same material, selected from the above list, be it to simplify the fabrication process.

In general, the present devices 10 may be structurally designed such that the minimal distance between a lower layer of the stack 108 of III-V semiconductor gain materials and the tapered Si waveguide core 102 is between 10 and 1000 nm (as measured along axis z in the appended drawings). Yet, as more flexibility is obtained in the structural design of the present devices, thanks to the higher refractive index material 103, the gap between the III-V stack and the Si waveguide core need not be confined to small distance (~300 nm) as when using $SiO_2$ as a separation layer. Thus, the minimal distance may be between 300 and 800 nm and more preferably, between 400 and 600 nm.

Finally, according to another aspect, the invention can be embodied as a method of operating a laser device 10 such s described hereinbefore. Essentially, this method comprises energizing the stack 108 of III-V semiconductor gain materials (e.g., to electrically pump the laser), to cause a hybrid-mode optical coupling of radiation between the stack 108 of III-V gain materials and the waveguide core 102. As discussed earlier in detail and as for instance illustrated in FIGS. 5 and 6, the coupling of the fundamental transverse optical mode is favored over that of higher-order transverse optical modes, so as to prevent the later from lasing.

The above embodiments have been succinctly described in reference to the accompanying drawings and may accommodate a number of variants. Several combinations of the above features may be contemplated. Examples are given in the next section.

2. Specific Embodiments and Technical Implementation Details

A III-V layer stack 105, 108, 109 can for instance be brought into contact (e.g., by bonding) with a pre-fabricated photonics chip, which consists of a substrate 100, a buried insulator layer 101 and a silicon waveguide core 102, formed from a top Si layer of an initial substrate (initially comprising full layers 100-102), see FIGS. 3-4.

In the example of FIGS. 3-4, the III-V stack consists of a lower layer 105 having one kind of conductivity (e.g., n-doped), an active area 108 with multiple quantum wells, and an upper layer 109 of another kind of conductivity (e.g., p-doped). This structure is patterned as shown in FIGS. 3-4, where layer 106 is a passivation layer and layer 111 is a cladding layer. References 107, 110s denote ohmic contacts (for contacting respective layers 105, 109), and references 112a-112c pertain to electrodes (or vias, etc.), as described earlier. The dimensions of the structures as depicted in FIGS. 1-4 are not necessarily to scale.

At the level of section C-C (FIG. 4), the width of waveguide core 102 is larger than in section B-B (FIG. 3). In FIG. 4, the fundamental mode has its largest part of intensity confined in the waveguide core 102, as otherwise depicted in FIG. 5B. Higher-order modes reside mainly in the III-V stack (FIGS. 5C-5F). This is achieved thanks to the damper 110c, 110s formed in the upper structure, above the stack 108. Namely, contact stripes 110s are bridged by the portion 110c, which is close enough to the active area of the stack 108, whereby losses for higher order modes become substantially increased. Still, tapers are suitably designed to allow a quasi-lossless transition of the fundamental mode from the III-V stack 108 into the waveguide 102.

FIG. 6 shows a longitudinal cross-section (as in FIG. 2), wherein the mode is propagating in-plane, parallel to direction y. Above the DFB regions, most of the intensity of each of the fundamental mode and the higher-order is confined in the III-V stack. In the adiabatic coupling region (tapers), the fundamental mode is first transferred to the waveguide 102 (thanks to taper 1022) and then back to the III-V region (thanks to taper 1024). In the damper region 110c, losses are considerably increased for higher-order modes. In a thin III-V stack 108, as assumed in FIGS. 1-4, the losses are typically two orders of magnitude larger than for the fundamental mode (in layer 102). Thus, the threshold for higher-order modes is significantly increased.

As the one skilled in the art will appreciate, the present devices can typically be achieved by usual processing steps (optical or electron beam lithography, selective epitaxy deposition, bonding, etching, patterning, metal and dielectric deposition etc.).

Some of the methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly listed in respect of layers 100-112 could be used, to obtain devices functionally similar to those as described hereinbefore.

What is claimed is:

1. A hybrid III-V on silicon laser device, comprising a layer structure with:
   a stack of III-V semiconductor gain materials stacked along a stacking direction z perpendicular to a main plane of the stack;
   a silicon waveguide core extending along a longitudinal direction parallel to the main plane of the stack of III-V semiconductor gain materials; and
   a cladding layer, extending between said waveguide core and said stack of III-V semiconductor gain materials,
   wherein the silicon laser device further comprises an optical coupling structure formed in the layer structure, which coupling structure is designed:
      to allow a hybrid-mode optical coupling of radiation between the stack of III-V semiconductor gain materials and the silicon waveguide core; and
      to favor a coupling of a fundamental transverse optical mode of said radiation over a coupling of one or more higher-order transverse optical modes of said radiation from the stack of III-V semiconductor gain materials into the waveguide core, so as to prevent said one or more higher-order transverse optical modes from lasing, in operation.

2. The laser device according to claim 1, wherein
   the coupling structure is further designed to favor the coupling of the fundamental transverse optical mode over the coupling of all of the higher-order transverse optical modes from the stack of III-V semiconductor gain materials into the waveguide core, so as to prevent said all of the higher-order transverse optical modes from lasing, in operation.

3. The laser device according to claim 1, wherein said coupling structure comprises:
   tapers structured in said waveguide core, the tapers designed to allow said radiation to be optically coupled between the stack of III-V semiconductor gain materials, wherein the tapers are designed to favor optical coupling of the fundamental transverse mode between the stack of III-V semiconductor gain materials and the waveguide core; and
   a damper configured to damp the one or more higher-order transverse optical modes in said stack.

4. The laser device according to claim 3, wherein
   the damper comprises a layer portion of material extending parallel to said stack of III-V semiconductor gain materials, centered thereon, opposite to the waveguide core with respect to the stack, and dimensioned so as to damp the one or more higher-order transverse optical modes in said stack.

5. The laser device according to claim 4, wherein the device further comprises:
   a pair of doped layers of semiconductor materials, including a first doped layer and a second doped layer, the pair comprising an n-doped layer and a p-doped layer, wherein the pair of doped layers extend essentially parallel to said main plane, on respective sides of the stack, so as for the waveguide core to extend opposite to the stack of III-V semiconductor gain materials with respect to the first doped layer; and
   two sets of ohmic contacts, including a first set and a second set, in contact with the first doped layer and the second doped layer, respectively, wherein the second set of ohmic contacts is structured so as to form said damper.

6. The laser device according to claim 5, wherein
said first doped layer is the n-doped layer and the second doped layer is the p-doped layer.

7. The laser device according to claim 5, wherein
the second set of ohmic contacts is structured so as to form two parallel strips extending laterally along two opposite edges of the stack, the two strips connected by said layer portion of material.

8. The laser device according to claim 7, wherein
the two parallel strips extend laterally at said opposite edges of the stack, so as for said layer portion of material to form, together with sections of the strips it connects, a section that extends substantially over a whole width of the stack.

9. The laser device according to claim 4, wherein
the device is configured so as for the optical propagation loss for the coupling of the one or more higher-order transverse optical modes to be of at least 1.0 dB.

10. The laser device according to claim 9, wherein
the device is configured so as for the optical propagation loss for the coupling of the one or more higher-order transverse optical modes to be of at least 3.0 dB.

11. The laser device according to claim 9, wherein
the device is configured so as for the optical propagation loss for the coupling of the fundamental transverse optical modes not to exceed 0.3 dB.

12. The laser device according to claim 11, wherein
the device is configured so as for the optical propagation loss for the coupling of the fundamental transverse optical modes not to exceed 0.1 dB.

13. The laser device according to claim 1, wherein
said device is configured as one of:
 a distributed feedback laser;
 a distributed Bragg reflector laser; and
 a ring laser.

14. The laser device according to claim 13, wherein
said device is configured as a distributed feedback laser, and the waveguide core is structured so as to comprise: an input portion; a middle portion; and an output portion, wherein:
 the middle portion is connected to the input portion and the output portion via respective tapers that widen, each, inwardly toward the middle portion; and
 each of the input portion and the output portion comprises a distributed feedback reflector.

15. The laser device according to claim 1, wherein
said stack of III-V semiconductor gain materials has a form factor, whereby an average dimension of the stack in a plane parallel to its main plane is substantially larger than an average dimension of the stack along said stacking direction z.

16. The laser device according to claim 15, wherein
an average thickness of said stack of III-V semiconductor gain materials is between 50 nm and 400 nm.

17. The laser device according to claim 15, wherein
said average thickness of the stack is between 220 nm and 290 nm.

18. The laser device according to claim 5, wherein
the cladding layer comprises a material arranged between the bonding layer and the waveguide core, said material having a refractive index that is equal or larger than 1.54 for said radiation and a bandgap, which, in energy units, is larger than an average energy of said radiation.

19. The laser device according to claim 18, wherein
a minimal distance between a lower layer of said stack of III-V semiconductor gain materials and each of the tapered waveguide core is between 10 and 1000 nm.

20. A method of operating the laser device according to claim 1, wherein the method comprises
energizing the stack of III-V semiconductor gain materials to cause a hybrid-mode optical coupling of radiation between the stack of III-V semiconductor gain materials and the silicon waveguide core, wherein the coupling of the fundamental transverse optical mode is favored over the coupling of the one or more higher-order transverse optical modes, so as to prevent said one or more higher-order transverse optical modes from lasing.

* * * * *